United States Patent
Cha et al.

(10) Patent No.: US 9,613,717 B2
(45) Date of Patent: Apr. 4, 2017

(54) ERROR CORRECTION CIRCUIT AND SEMICONDUCTOR MEMORY DEVICE INCLUDING THE SAME

(71) Applicant: SK hynix Inc., Gyeonggi-do (KR)

(72) Inventors: Jae-Won Cha, Gyeonggi-do (KR); Jae-Woo Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 59 days.

(21) Appl. No.: 14/855,092

(22) Filed: Sep. 15, 2015

(65) Prior Publication Data

US 2016/0314041 A1    Oct. 27, 2016

(30) Foreign Application Priority Data

Apr. 22, 2015 (KR) .................. 10-2015-0056599

(51) Int. Cl.
| | | |
|---|---|---|
| H03M 13/00 | (2006.01) | |
| G11C 29/52 | (2006.01) | |
| G06F 11/10 | (2006.01) | |
| G11C 29/42 | (2006.01) | |
| G11C 29/44 | (2006.01) | |
| G11C 29/04 | (2006.01) | |

(52) U.S. Cl.
CPC .......... G11C 29/52 (2013.01); G06F 11/1068 (2013.01); G11C 29/42 (2013.01); G11C 29/44 (2013.01); *G11C 2029/0411* (2013.01)

(58) Field of Classification Search
CPC ......... G11C 29/42; G11C 29/44; G11C 29/52; G11C 29/88; H03M 13/05
See application file for complete search history.

(56) References Cited

U.S. PATENT DOCUMENTS

| | | | | |
|---|---|---|---|---|
| 5,109,360 | A * | 4/1992 | Inazumi | G11C 29/88 365/200 |
| 8,601,331 | B2 | 12/2013 | Nobunaga et al. | |
| 8,914,708 | B2 * | 12/2014 | Meaney | H03M 13/05 714/766 |
| 2014/0337669 | A1 * | 11/2014 | Solhusvik | G11C 29/08 714/32 |
| 2015/0293173 | A1 * | 10/2015 | Tsuboi | G01R 31/3177 714/727 |

FOREIGN PATENT DOCUMENTS

KR    1020130021196    3/2013

* cited by examiner

*Primary Examiner* — Shelly A Chase
(74) *Attorney, Agent, or Firm* — IP & T Group LLP

(57) ABSTRACT

An error correction circuit includes: a failure detection unit suitable for detecting failed data among a plurality of data; a data output control unit suitable for selectively outputting test data corresponding to a predetermined amount of data excluding the failed data; and an error correction unit suitable for performing a unit ECC operation on the test data.

15 Claims, 3 Drawing Sheets

ERROR CORRECTION CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2015-0056599, filed on Apr. 22, 2015, which is incorporated herein by reference in its entirety.

BACKGROUND

1. Field

Various embodiments of the present invention relate to a semiconductor design technology, and more particularly, to a semiconductor device which performs an error correction code (ECC) operation.

2. Description of the Related Art

After semiconductor memory devices are fabricated, a test is performed to screen for failures, for example, failed memory cells. Column address information corresponding to the failed memory cells is stored in a storage unit. The semiconductor memory devices perform an ECC operation to correct errors in data. When the semiconductor memory devices have a failed column, an ECC operation is not performed on the failed column.

When a semiconductor memory device performs an ECC operation on column lines, the semiconductor memory device may not perform the ECC operation on all of the columns lines at one time, but perform an ECC operation on a group column lines. An ECC operation performed on a group of column lines is referred to as a unit ECC operation. Conventionally, the number of column lines in a unit ECC operation had been set as a fixed value. Therefore, when there was a failed column within a group, the semiconductor memory device ignored the failed column line and performs an ECC operation on the remaining column lines. Thus, when failed column lines were within the group, the number of valid column lines on which the ECC operation was performed was reduced by the number of failed column lines. For example, when a group for a unit ECC operation has 1024 bytes of column lines and 3 bytes of failed column lines, valid column lines may be reduced to 1021 bytes, thereby degrading the efficiency of ECC operations.

SUMMARY

Various embodiments are directed to a semiconductor device which is capable of detecting failed column lines and reflecting the detection result into an ECC operation.

In an embodiment, an error correction circuit may include: a failure detection unit suitable for detecting failed data; a data output control unit suitable for selectively outputting test data corresponding to a predetermined number of data excluding the failed data; and an error correction unit suitable for performing a unit ECC operation on the test data.

The fail detection unit may detect a failure in circuits in which the data are stored and lines through which the data are transmitted.

In an embodiment, a semiconductor memory device may include: a memory cell array including a plurality of memory cells coupled to a plurality of column lines; a failure detection unit suitable for detecting a number of failed column lines; a column address generation unit suitable for generating test addresses based on the number of failed column lines; a column driving unit suitable for driving column lines corresponding to a unit ECC operation based on the test addresses; and an error correction unit suitable for performing the unit ECC operation on test data corresponding to the column lines.

The fail detection unit may include: a data sensing unit suitable for sensing logic levels of the test data and detecting whether a failure has occurred in the column lines; and a counting unit suitable for counting the number of failed column lines based on the detection result.

The address generation unit may generate the test addresses based on the number of failed column lines, which is an output of the counting unit.

The test data may exclude data outputted from the failed column lines.

The column driving unit may include: a plurality of page buffers for read/write operations of the memory cells; and a column decoder suitable for selectively driving the page buffers coupled to column lines corresponding to the test addresses.

In an embodiment, an operating method of a semiconductor memory device may include: initially setting a plurality of test addresses for a unit ECC operation among a plurality of column addresses; detecting failed addresses; resetting the test addresses to exclude the failed addresses; and performing the unit ECC operation on data corresponding to the reset test addresses.

The detecting of the failed addresses may include: sensing logic levels of data corresponding to the column addresses; and determining whether a failure has occurred in the column addresses, according to the latched data levels.

The resetting of the test addresses may include: counting the failed addresses according to whether the failure has occurred in the column addresses; and reflecting the counted result into the test addresses.

The reflecting of the counted result may include adding a value corresponding to the counted result to the maximum value of the test addresses.

The operating method may further include performing the unit ECC operation on data corresponding to the initially set test addresses.

The performing of the unit ECC operation may include: performing the unit ECC operation on first data corresponding to the initially set test addresses; and performing the unit ECC operation on second data corresponding to the initially set test addresses.

Data corresponding to the reset test addresses may comprise data obtained by adding data in which data corresponding to the failed addresses is excluded in the first data to a part of the second data.

The amount of the part of the second data may be equal to the amount of data corresponding to the failed addresses.

DETAILED DESCRIPTION

Figure 1:
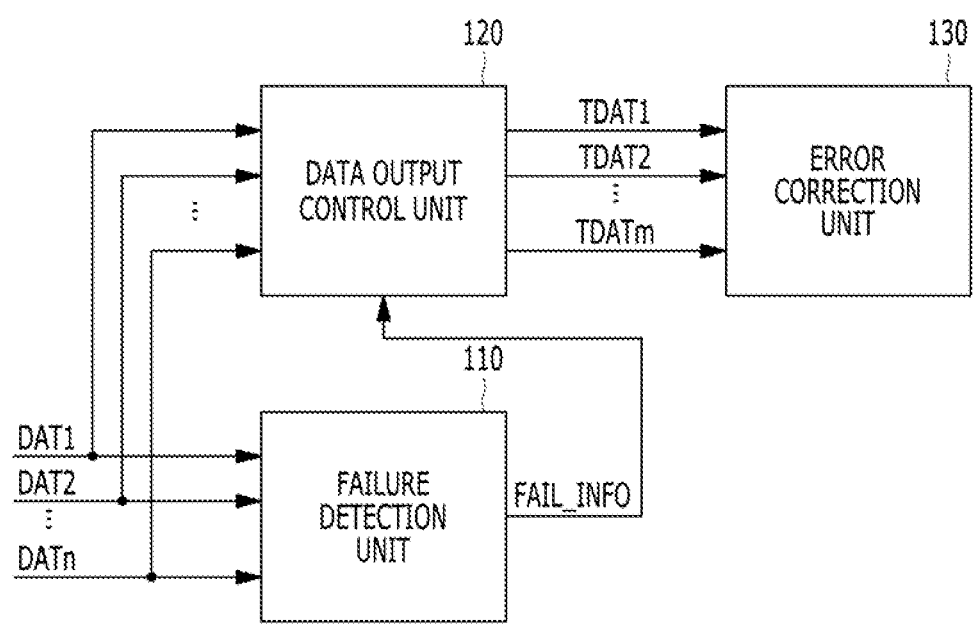
FIG. 1 is a clock diagram illustrating an error correction circuit in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In this disclosure, when one part is referred to as being 'connected' to another part, it should be understood that the former can be 'directly connected' to the latter, or 'electrically connected' to the latter via an intervening part. Furthermore, when it is described that one comprises (or includes or has) some elements, it should be understood that it may comprise (or include or has) only those elements, or it may comprises (or includes or have) other elements as well as those elements if there is no specific limitation. The terms of singular form may include plural forms unless stated otherwise.

FIG. 1 is a block diagram illustrating an error correction circuit in accordance with an embodiment of the present invention.

Referring to FIG. 1, the error correction circuit may include a failure detection unit 110, a data output control unit 120, and an error correction unit 130.

The failure detection unit 110 may receive a plurality of data DAT1 to DATn through a plurality of data lines (where n is a natural number), detect a failure from circuits in which data are stored and lines through which data are transmitted, and output fail information FAIL_INFO. The failure detection unit 110 may sense logic levels of the data DAT to DATn, to detect whether a failure occurred. For example, when a failure occurs in the circuits in which the data DAT1 to DATn are stored and the lines through which the data are transmitted, a predetermined value may not be properly transmitted. Thus, the failure detection unit 110 may detect a failure by determining the value.

The data output control unit 120 may selectively output a plurality of test data TDAT1 to TDATm among the data DAT1 to DATn in response to the fail information FAIL_INFO indicating whether a failure has occurred in the data DAT1 to DATn (where m is a smaller natural number than n). The test data TDAT1 to TDATm may have the maximum value of data on which a unit ECC operation may be performed. The unit ECC operation is performed on each group corresponding to a predetermined amount of data, when the ECC operation is performed on the data DAT1 to DATn.

The data output control unit 120 may determine that a circuit in which failed data is stored and a line through which failed data is transmitted are a failed circuit and a failed line, according to the fail information FAIL_INFO. In this case, the data outputted from the corresponding circuit and line may not be included in the test data TDAT1 to TDATm. For example, when the maximum amount of the test data TDAT1 to TDATm for a unit ECC operation is 1024 bytes and 3 bytes of failed data are in the test data TDAT1 to TDATm, the failed data corresponding to 3 bytes may not be included in the test data TDAT1 to TDATm, but data from 1024 to 1026 bytes, corresponding to 3 bytes inputted after 0 to 1023 bytes of the data DAT1 to DATn, may be included in the test data TDAT1 to TDATm. In other words, the data output control unit 120 may ignore the failed data (i.e., the data outputted from the failed circuit and line), add valid data (i.e., data outputted from an available circuit and line by the amount of the failed data), and secure the maximum amount of test data TDAT1 to TDATm.

The error correction unit 130 may perform an ECC operation on the test data TDAT1 to TDATm outputted from the data output control unit 120.

That is, the error correction circuit may detect whether a failure has occurred in the data DAT1 to DATn, and selectively output the test data TDAT1 to TDATm for the unit ECC operation according to the detection result. In other words, when failed data exists within the maximum amount for the unit ECC operation, the error correction circuit may ignore the failed data, add valid data by the amount of the failed data, and secure the maximum amount of data for the unit ECC operation. Therefore, since the amount of valid data is not reduced even though failed data occurs, the condition of the ECC operation is not changed. Thus, the reliability screening and the test results may be improved.

Figure 2:
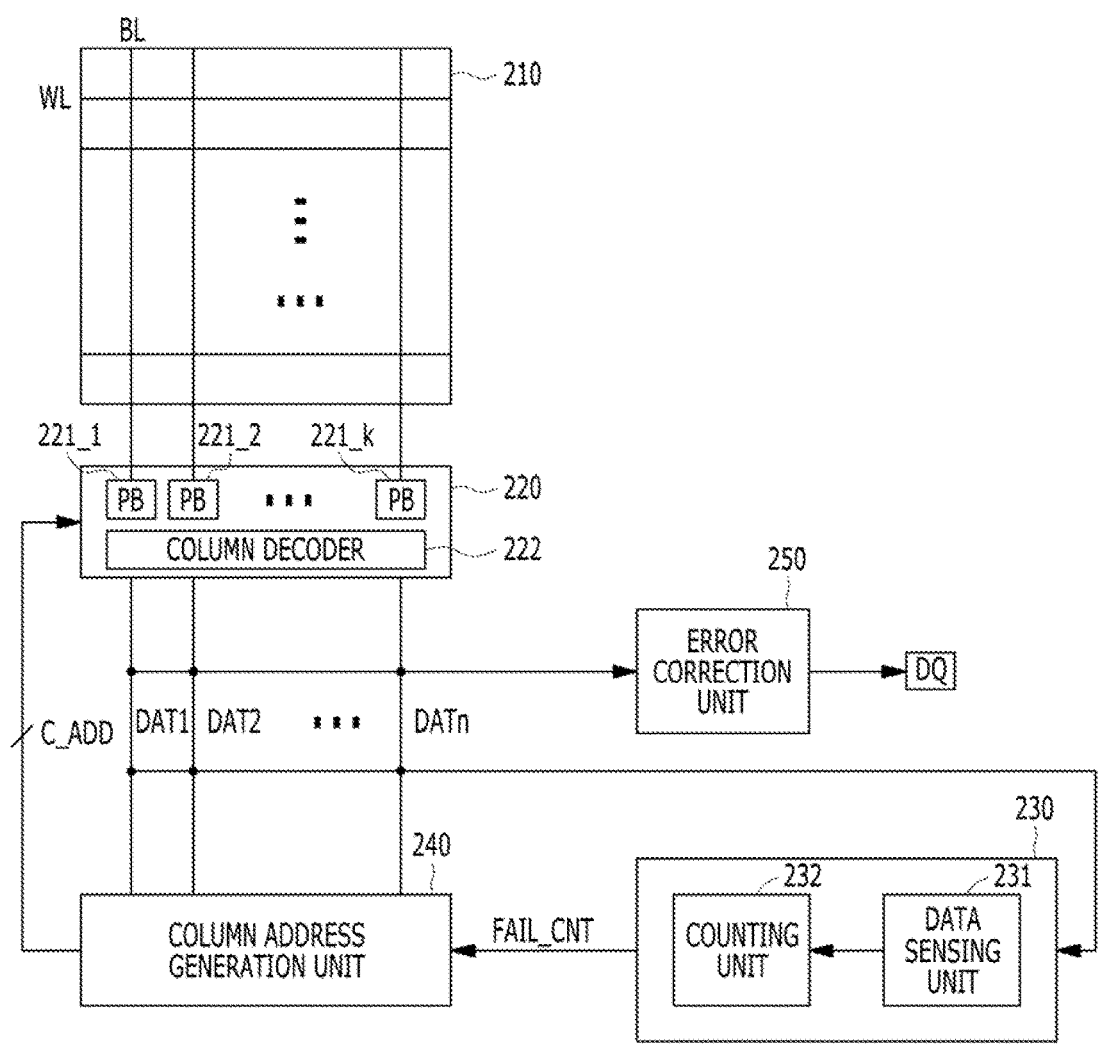
FIG. 2 is a block diagram illustrating a semiconductor memory device in accordance with an embodiment of the present invention.

FIG. 2 is a block diagram illustrating a semiconductor memory device in accordance with an embodiment of the present invention.

Referring to FIG. 2, the semiconductor memory device may include a memory cell array 210, a column driving unit 220, a failure detection unit 230, a column address generation unit 240, and an error correction unit 250.

The memory cell array 210 may include a plurality of memory cells (not illustrated), and the memory cells may be coupled to bit lines BL (hereafter, referred to as column lines) and word line WLs.

The column driving unit 220 may include a plurality of page buffers (PBs) 221_1 to 221_k and a column decoder 222, where k is a natural number.

The page buffers 221_1 to 221_k may operate as write drivers or sense amplifiers according to an operation mode. For example, the page buffers 221_1 to 221_k may operate as write drivers for storing data inputted through input/output buffers (not illustrated) in memory cells of the memory cell array 210 during a program operation. For this operation, the page buffers 221_1 to 221_k may include a cache latch (not illustrated) configured to temporarily store input data. Further, the page buffers 221_1 to 221_k may operate as sense amplifiers to output data read from memory cells of the memory cell array 210 during a read operation. In an embodiment of the present invention, the operation of the page buffers 221_1 to 221_k as sense amplifiers will be described.

The column decoder 222 may decode a plurality of column addresses C_ADD and selectively enable the page buffers 221_1 to 221_k.

The fail detection unit 230 may detect the number of failed column lines according to whether a failure has occurred in test data DAT1 to DATn stored in memory cells coupled to a plurality of column lines.

The fail detection unit 230 may include a data sensing unit 231 and a counting unit 232.

The data sensing unit 231 may sense the levels of the test data DAT1 to DATn corresponding to the column lines, and detect whether a failure occurred. The test data DAT1 to DATn corresponding to the column lines may include data read from memory cells coupled to the column lines. Furthermore, the data sensing unit 231 may detect whether a failure has occurred in the test data DAT1 to DATn corresponding to all of the column lines. At this time, the column addresses C_ADD inputted to the column decoder 222 may include column addresses C_ADD corresponding to all of the column lines.

The counting unit 232 may count the number of failed column lines FAIL_CNT in response to the detection result to output the counted value.

In other words, the fail detection unit 230 may detect the number of failed column lines FAIL_CNT according to whether a failure has occurred in the data stored in the memory cells coupled to the column lines.

The column address generation unit 240 may generate the column addresses C_ADD as test addresses according to the number of failed column lines FAIL_CNT. The initially generated addresses are referred to as first test addresses, and addresses which are reset (or reconfigured) and generated according to the number of failed column lines are referred to as second test addresses. The first test addresses may indicate column addresses corresponding to all column lines, and the second test addresses may indicate the maximum number of addresses for the unit ECC operation among the column addresses corresponding to all of the column lines. That is, the second test addresses indicate addresses excluding addresses corresponding to failed column lines. For example, when the maximum number of second test addresses for the unit ECC operation is 1024 bytes, the column addresses corresponding to all of the column lines, that is, the first test addresses may include all column addresses containing the maximum number of column addresses for the unit ECC operation. When failed column addresses exist within the 1024 bytes, the second test addresses may be reset by excluding the failed column addresses and adding valid addresses among addresses following 1024 bytes by the number of failed column addresses.

Although not illustrated, the column address generation unit 240 may receive information on failed column addresses from a CAM cell (not illustrated).

The column driving unit 220 may drive column lines corresponding to the unit ECC operation among the column lines in response to the column addresses C_ADD that are reset according to the number of failed column lines, that is, the second test addresses.

The error correction unit 250 may perform a unit ECC operation on test data outputted from the column lines which are driven in response to the second test addresses.

Figure 3:
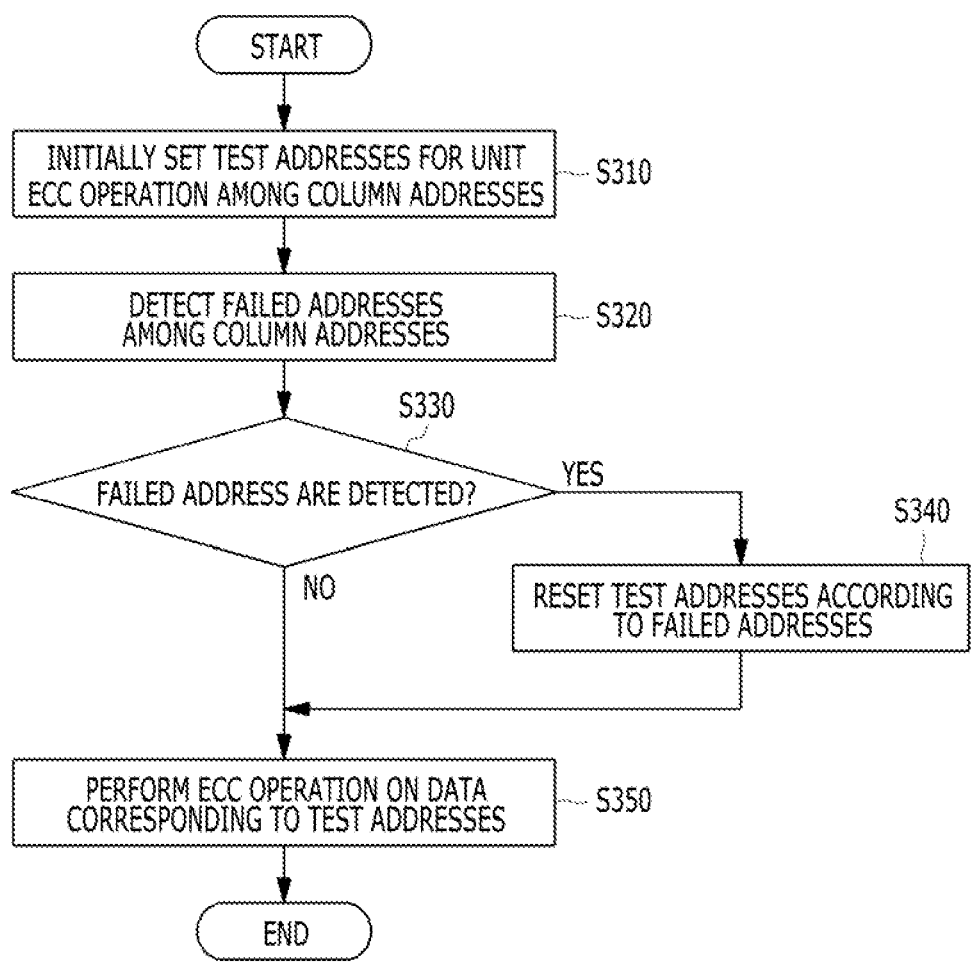
FIG. 3 is a flowchart for describing an operation of the semiconductor memory device shown in FIG. 2.

FIG. 3 is a flowchart for describing an operation of the semiconductor memory device shown in FIG. 2.

Referring to FIGS. 2 and 3, the column address generation unit 240 may initially set test addresses for a unit ECC operation among a plurality of column addresses, at step S310.

The fail detection unit 230 may detect failed addresses among the column addresses at step S320. When detecting the failed addresses, the data sensing unit 231 may sense logic levels of data corresponding to the column addresses, and detect whether a failure has occurred in the column addresses. When the failed addresses are detected at step S330 the column address generation unit 240 may reset (or reconfigure) test addresses in response to the failed addresses, at step S340. Specifically, when failed addresses are detected among a predetermined number of test addresses which are initially set, the column address generation unit 240 resets the test addresses by adding valid addresses corresponding to the number of failed addresses. Then, the error correction unit 250 may perform an ECC operation on data corresponding to the reset test addresses at step S350.

On the other hand, when no failed addresses are detected at step S340, the error correction unit 250 may perform an ECC operation on the data corresponding to the initially set test addresses at step S350.

That is, the semiconductor memory device may detect whether a failure has occurred in the column lines, and count the number of failed column lines. Furthermore, the semiconductor memory device may reset the maximum value for the unit ECC operation, that is, the predetermined number of test addresses according to the number of failed column lines. In other words, when addresses corresponding to the failed column lines are within the maximum value for the unit ECC operation, the semiconductor memory device may ignore the failed column addresses, and add valid addresses corresponding to the number of failed addresses, thereby maintaining the maximum number of test addresses for the unit ECC operation. Thus, the semiconductor memory device may add valid addresses corresponding to the number of failed column lines to the test addresses and perform the unit ECC operation. Therefore, although failed addresses exist, the condition of an ECC operation is not changed. As a result, the reliability of screening and test results may be improved.

Although various embodiments have been described for illustrative purposes, it will be apparent to those skilled in the art that various changes and modifications may be made without departing from the spirit and scope of the invention as defined in the following claims.

What is claimed is:

1. An error correction circuit comprising:
   a failure detection unit suitable for detecting failed data;
   a data output control unit suitable for selectively outputting test data corresponding to a predetermined number of data excluding the failed data; and
   an error correction unit suitable for performing a unit ECC operation on the test data.

2. The error correction circuit of claim 1, wherein the fail detection unit detects a failure in circuits in which the data are stored and lines through which the data are transmitted.

3. A semiconductor memory device comprising:
   a memory cell array including a plurality of memory cells coupled to a plurality of column lines;
   a failure detection unit suitable for detecting a number of failed column lines;
   a column address generation unit suitable for generating test addresses based on the number of failed column lines;
   a column driving unit suitable for driving column lines corresponding to a unit ECC operation based on the test addresses; and
   an error correction unit suitable for performing the unit ECC operation on test data corresponding to the column lines.

4. The semiconductor memory device of claim 3, wherein the fail detection unit comprises:
   a data sensing unit suitable for sensing logic levels of the test data and detecting whether a failure has occurred in the column lines; and
   a counting unit suitable for counting the number of failed column lines based on the detection result.

5. The semiconductor memory device of claim 4, wherein the address generation unit generates the test addresses based on the number of failed column lines, which is an output of the counting unit.

6. The semiconductor memory device of claim 3, wherein the test data excludes data outputted from the failed column fines.

7. The semiconductor memory device of claim 3, wherein the column driving unit comprises:
   a plurality of page buffers for read rite operations of the memory cells; and a column decoder suitable for selectively driving the page buffers coupled to column lines corresponding to the test addresses.

8. An operating method of a semiconductor memory device, comprising:
initially setting a plurality of test addresses for a unit ECC operation among a plurality of column addresses;
detecting failed addresses;
resetting the test addresses to exclude the failed addresses; and
performing the unit ECC operation on data corresponding to the reset test addresses.

9. The operating method of claim wherein the detecting of the failed addresses comprises:
sensing logic levels of data corresponding to the column addresses; and
determining whether a failure has occurred in the column addresses, according to the latched data levels.

10. The operating method of claim 9, wherein the resetting of the test addresses comprises:
counting the failed addresses according to whether the failure has occurred in the column addresses; and
reflecting the counted result into the test addresses.

11. The operating method of claim 10, wherein the reflecting of the counted result includes adding a value corresponding to the counted result to the maximum value of the test addresses.

12. The operating method of claim 8, further comprising performing the unit ECC operation on data corresponding to the initially set test addresses.

13. The operating method of claim 12, wherein the performing of the unit ECC operation comprises:
performing the unit ECC operation on first data corresponding to the initially set test addresses; and
performing the unit ECC operation on second data corresponding to the initially set test addresses.

14. The operating method of claim 13, wherein data corresponding to the reset test addresses comprises data obtained by adding data in which data corresponding to the failed addresses is excluded in the first data to a part of the second data.

15. The operating method of claim 14, wherein the amount of the part of the second data is equal to the amount of data corresponding to the failed addresses.

* * * * *